United States Patent
Luo

(10) Patent No.: US 9,040,910 B2
(45) Date of Patent: May 26, 2015

(54) MULTI-COLUMN ELECTRON BEAM INSPECTION THAT USES CUSTOM PRINTING METHODS

(71) Applicant: Tao Luo, Singapore (SG)

(72) Inventor: Tao Luo, Singapore (SG)

(73) Assignee: Tao Luo, Edgefield Plains (SG)

( * ) Notice: Subject to any disclaimer, the term of this patent is extended or adjusted under 35 U.S.C. 154(b) by 0 days.

(21) Appl. No.: 14/281,772

(22) Filed: May 19, 2014

(65) Prior Publication Data

US 2014/0346350 A1    Nov. 27, 2014

Related U.S. Application Data

(60) Provisional application No. 61/826,500, filed on May 23, 2013.

(51) Int. Cl.
*H01J 37/02* (2006.01)
*H01J 37/26* (2006.01)
*H01J 37/28* (2006.01)

(52) U.S. Cl.
CPC .............. *H01J 37/02* (2013.01); *H01J 37/265* (2013.01); *H01J 37/28* (2013.01); *H01J 2237/2826* (2013.01)

(58) Field of Classification Search
USPC .......................................... 250/307, 306, 310
See application file for complete search history.

(56) References Cited

U.S. PATENT DOCUMENTS

2003/0001095 A1*  1/2003  Lo et al. ................. 250/346

* cited by examiner

*Primary Examiner* — Kiet T Nguyen
(74) *Attorney, Agent, or Firm* — FSP LLC

(57) ABSTRACT

A method of testing for photomask print errors includes dividing a photomask print into sub-regions and inspecting each sub-region with a different (e.g., electron) beam column, each sub-region aligned with a beam column axis during a calibration process. The different sub-regions may be inspected on different photomask prints on a wafer plane.

13 Claims, 17 Drawing Sheets

US 9,040,910 B2

MULTI-COLUMN ELECTRON BEAM INSPECTION THAT USES CUSTOM PRINTING METHODS

PRIORITY CLAIM

The present application claims priority under 35 U.S.C. 119 to U.S. application Ser. No. 61/826,500, filed on 23 May 2013, which is incorporated herein by reference in its entirety.

BACKGROUND

Patterned wafer defect inspection of integrated circuit (IC) chips locates the failures in chip manufacturing process, and thus leads to yield improvement by fine tuning the process parameters to minimize failure rates. There are two major types of semiconductor wafer inspection techniques—light optical inspection, which uses a light source as an illumination source, and scanning electron beam inspection, which uses electrons as an illumination source.

Optical inspection systems often use parallel imaging techniques, which allows a high data acquisition rate and provides a high throughput of wafer inspected per hour. For a 300 mm wafer, it typically takes a few hours for an optical inspection system to scan the whole wafer. An optical inspection system's resolution is limited by diffraction aberration due to relatively large wavelengths of photons. Compared to photons, electrons have significantly smaller wavelength, which provides scanning electron beam inspection tools higher resolution and capability (relative to optical inspection systems) to identify wafer defects of a few nanometers in size. However, scanning electron beam inspection tools use a sequential data acquisition method, which limits the throughput of wafers inspected. For example, currently available systems can take more than a month to completely inspect a 300 mm wafer at the 20 nm IC design rule. Therefore, many researchers have proposed multiple electron beam system to scan and inspect the same wafer for parallel data acquisition in order to achieve the same high resolution with increased throughput.

A multiple electron beam inspection system utilizing parallel data acquisition may increase the throughput and shorten the time to inspect a wafer. However, the data acquisition rate of a scanning electron beam inspection system is limited to about 400 mega pixel per second. Therefore, more than 10,000 ideal parallel electron beams are needed to scan a full wafer within an hour for 14 nm and 10 nm chip design rules. It is expensive and impractical to build a multi-column hardware with 10,000 ideal beams. On the other hand, it is relatively easy to make a multi-column system with about 100 beams, but such a multi-column system will take more than a week to scan a full wafer. Many defect inspection applications do not require defect information of a full wafer, and only a part of a wafer needs to be inspected for these applications. For example, defects on a photomask (reticle) will be printed at the same coordinate of different repeated patterned regions on a wafer. Therefore, these repeating defects from photomask can be capture by inspecting only one of the repeated patterned regions. For partial wafer inspection applications, it is very difficult to efficiently collect only desired information because the imaging positions are fixed by the multi-column hardware while the targeted inspection regions of the integrated circuit chips are distributed on a production wafer according to chip dimensions. All multi-column hardware, which target to only inspect part of the wafer, suffer from this misalignment between column arrangements and chip arrangements on a production wafer.

BRIEF DESCRIPTION OF THE DRAWINGS

In the drawings, the same reference numbers and acronyms identify elements or acts with the same or similar functionality for ease of understanding and convenience. To easily identify the discussion of any particular element or act, the most significant digit or digits in a reference number refer to the figure number in which that element is first introduced.

DETAILED DESCRIPTION

Preliminaries

Figure 1:
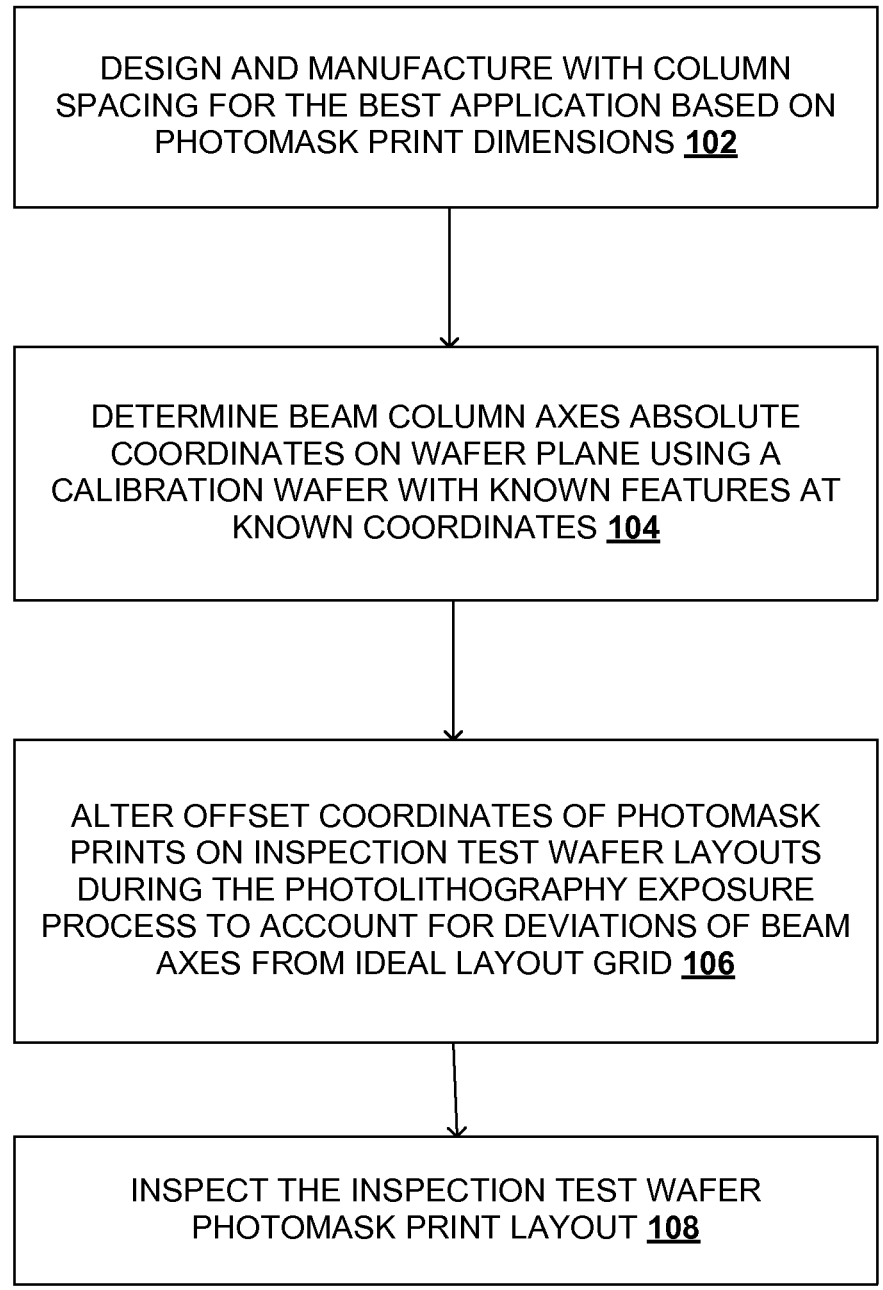
FIG. 1 illustrates a process embodiment for generating a photomask print layout on an inspection test wafer for multi-column inspection.

References to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other.

"Logic" refers to machine memory circuits, machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic.

Those skilled in the art will appreciate that logic may be distributed throughout one or more devices, and/or may be comprised of combinations memory, media, processing circuits and controllers, other circuits, and so on. Therefore, in the interest of clarity and correctness logic may not always be distinctly illustrated in drawings of devices and systems, although it is inherently present therein.

The techniques and procedures described herein for testing for print or process defects may be implemented via logic distributed in one or more computing devices. The particular distribution and choice of logic may vary according to implementation.

Overview

In a semiconductor wafer fabrication process, an inspection test wafer is created from a custom print layout, which may be different from the production wafer layout. This custom print layout is inspected for defects by a multi-column electron beam system (optical illuminations may also be used in some applications). The arrangement of electron optical axes of all columns determines where the images are taken, and what information is to be collected on a wafer. The physical multi-column optical axis arrangement is first calibrated using a calibration wafer to obtain each optical axis's wafer coordinates, which includes designed hardware arrangements, mechanical errors, and assembly tolerances. The inspection test wafer is processed under the same conditions as production wafers, except that the photolithography exposure step is modified to create an arrangement of photomask prints on the inspection test wafer plane in order to allocate targeted inspection sub-regions for different columns. The coordinates of sub-regions within photomask prints may be offset from one another both in the x and y dimensions on the inspection test wafer plane, by determined amounts.

Details of Example Embodiments

For printable photomask defect inspection, each column in the multi-column system inspects a different inspection sub-region of the repeated photomask print on an inspection test wafer plane. If some columns fail over time, the photomask print can be re-generated and re-divided into a different number of inspection sub-regions so that complete photomask print defect information can be captured collectively by the remaining working columns. Inspection sub-regions are defined each with the same dimensions and orientations. Critical regions of a repeated photomask print can be divided into inspection sub-regions, where column beam conditions in each sub-region are adjusted for optimum detection of defects. Inspection sub-regions can be further divided into different groups, and different groups on different inspection test wafers may be inspected by different multi-column inspection systems simultaneously.

In one embodiment, an inspection test wafer is processed in the same way as a production wafer in most respects. However, the photolithography exposure on the inspection test wafer plane is arranged such that different sub-regions of the photomask print are aligned to the multi-column beam inspection axes. The inspection test wafer may be processed under the same conditions as production wafers after exposure. Photolithographical defect inspection is carried out after post-development processes. The wafer plane photomask inspection can be carried out (but not limited to) either on the after-development layer, or on post-etching layer of the inspection test wafer. A review process may be applied to the inspection test wafer in order to further analyze and classify defects, and a photomask reparation process can be carried out based on mapping from the collective defect distribution on the wafer plane to the physical photomask coordinates corresponding to the detected defects. Sometimes, only certain critical areas of the photomask print needs to be inspected. In this case, the critical areas can be collectively inspected by using a customized lithographical recipe to print the inspection sub-regions of the critical regions with the same dimensions and orientations, such that each is inspected by a different column.

In one embodiment, an inspection test wafer is printed in a layout aligning different sub-regions of the photomask print on the inspection test wafer to positions of the multi-column optical axes. If a beam column fails over time, the photomask print is re-divided into a new layout, so that the remaining working beam columns still collectively cover the entire repeated pattern of a photomask print. The photomask print can be divided and laid out in different ways, provided the dimensions and orientations of each inspection sub-region are consistent (e.g., the same). 'Critical' regions of the photomask print may themselves be divided into inspection sub-regions, and beam column conditions may be set for each of these sub-regions for optimum detection of defects. Inspection sub-regions may be formed into groups. Different groups on different inspection test wafers can be inspected by different multi-column inspection system simultaneously.

Global process optimization and uniformity may be tested by arranging the repeated photomask prints on the wafer plane so that each beam column scans the same corresponding sub-region of each photomask print on wafer. The print layout can define sub-regions in different ways as long as the dimensions and orientations of every inspection sub-region are similar, e.g. the same. 'Critical' regions of the print can be divided into inspection sub-regions, which can be custom aligned to the multicolumn optical axes to optimize the throughput and defect sensitivity in different applications. Multiple inspection test wafers and multiple multi-column inspection systems (e.g., one per inspection test wafer) may be used to inspect different sub-regions.

Each beam column in the multi-column system inspects the same sub-regions in a separate and repeated photomask print on the wafer plane. If some columns fail over time, follow up inspection may be carried out by a single column electron beam system, capturing defects in the uninspected region(s). Critical areas of the photomask print may also be divided into inspection sub-regions, which can be custom aligned to the physical positions of the multicolumn optical axes in order to optimize the throughput and defect sensitivity in different applications. More than one inspection test layout (each on a separate wafer) and more than one multi-column inspection system can be used for inspection of different sub-regions of the overall photomask print. Overall defect distribution information can be analyzed to determine the root cause of failures in the wafer fabrication process.

Inspection of repeating and non-repeating defects can provide valuable information about process optimization and uniformity. Every photomask print undergoes the same wafer fabrication processes. Therefore, a change in defect density results from global process optimization or uniformity. Various types of processes may be inspected and optimized by using embodiments of the methods described herein, including, but not limited to, photolithography, deposition, etching, and rapid thermal annealing. A multi-column electron beam system may be utilized to simultaneously inspect the same circuit features at different wafer coordinates. Machining errors and mechanical tolerances of a multi-column hardware may be calibrated by analyzing the image of a known calibration target with known unique feature spacing, e.g. a calibration wafer. A same sub-region of the photomask print of a photolithography printing process is aligned to each beam column in the multi-column beam array. The inspection test wafer is processed by the same non-photolithography exposure process as production wafers. Non-repeating defects are identified (using a defect review system) and are indicative of non-photomask (e.g., process) related problems. The beam conditions for individual columns may be changed to be optimal for inspecting the corresponding sub-regions within the photomask print, optimizing captured image and defect sensitivity. This not only improves the defect capture rate, but also improves the throughput. For example, non-critical sub-regions of a print may be inspected with a large image pixel size to reduce the total number of inspection pixels required to cover the sub-region of interest, thus reducing the total inspection time.

If some beam columns break down over time, the corresponding sub-regions on the wafer may be inspected by an additional processing step utilizing a single beam inspection system.

To increase overall throughput, defect distribution in different sub-regions may be inspected by different multi-column systems on different inspection test wafers simultaneously.

Figure 2:
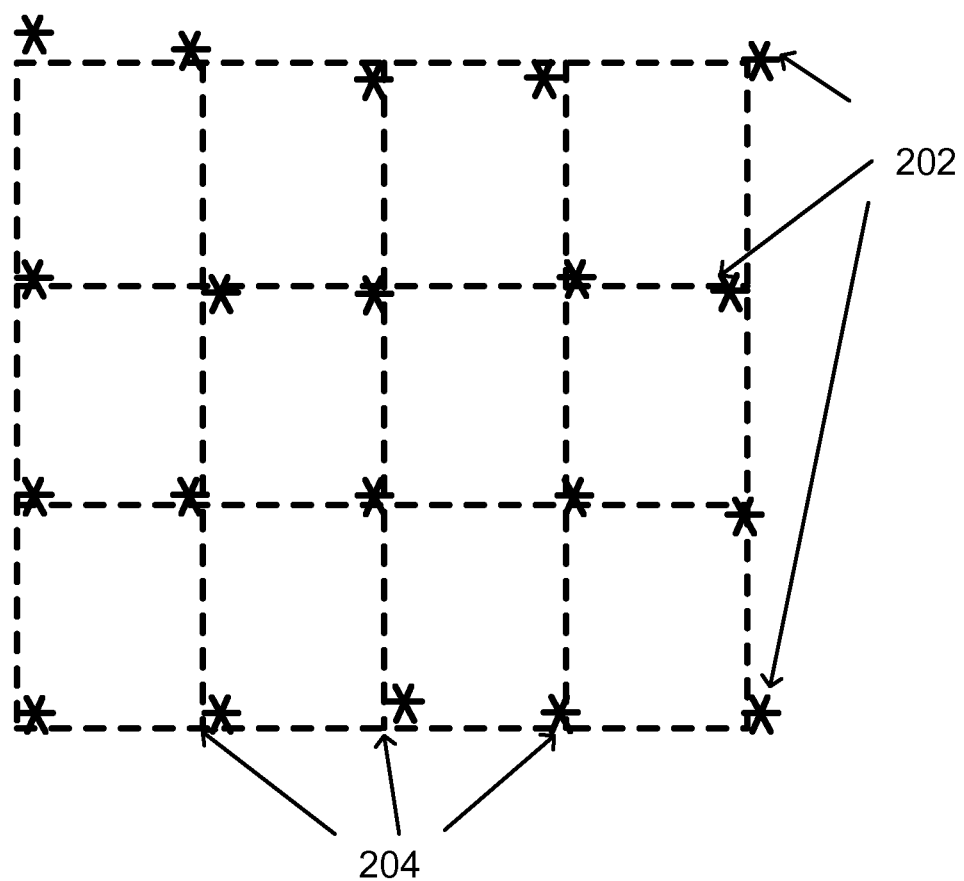
FIG. 2 illustrates deviation of practical column electron optical axes distribution from designed position distribution of column electron optical axes.

FIG. 1 illustrates a process embodiment for generating photomask prints on an inspection test wafer. The beam column spacing in the multi-column beam array inspection system is designed and manufactured to optimize applications based on production photomask print dimensions (102). The beam column spacing may be equally or unequally distributed. For example, if the largest photomask print size on the wafer is 26 mm by 32 mm, the multi-column axes array may be designed with spacing slightly larger than 26 mm by 32 mm so that each IC area under inspection will not overlap with another. Due to machining errors and tolerances, the physical electron optical axes positions may deviate from the design positions (see FIG. 2, where 202 are actual coordinates of the beam axes of a multiple beam column system, and 204 are the designed coordinates of the beam axes). Each beam axis position may be measured and calibrated (104), for example by stage movement of a standard or known physical feature to the center of the field of view of each column. This column beam axis position arrangement can be passed to photolithography machines. After learning the physical array coordinates of each electron beam column axis, a photolithography system can from time to time switch from a production recipe to perform a print for inspection recipe, which will print the photolithography sub-region of interest in alignment with the exact location of each electron optical column axis on the wafer plane (106). The photomask print layout then can more accurately be inspected by the multi-column beam array (108).

Figure 3:
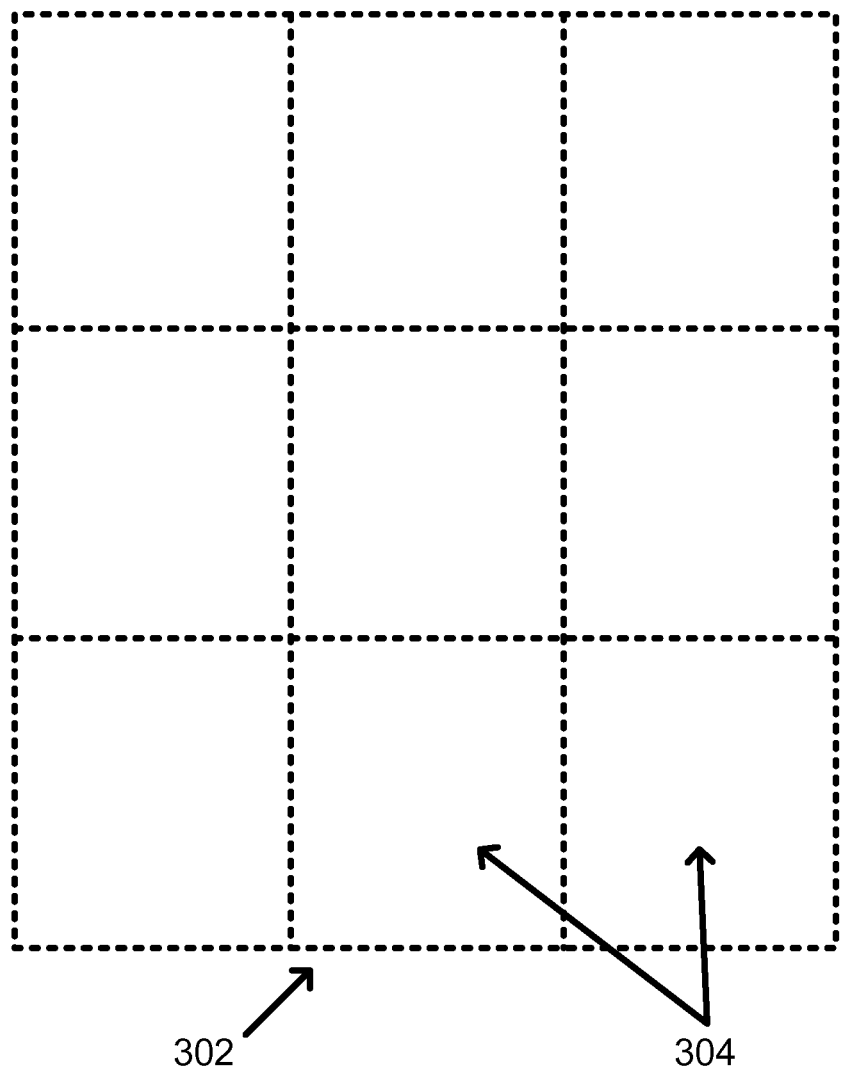
FIG. 3 illustrates an example of a photomask print on an inspection test wafer plane divided into nine (9) sub-regions for inspection by a 3×3 multi-column electron beam array.

A multi-column electron beam inspection system may utilize a custom (non-production) print of the photomask to enhance the inspection accuracy and/or efficiency. A full photomask print on the wafer plane is divided into different inspection sub-regions, which have similar (e.g., the same) dimensions and orientation. FIG. 3 illustrates an example of a photomask print (302) on the wafer plane divided into nine (9) sub-regions for inspection by a 3×3 multi-column electron beam array. Each sub-region (304) is aligned for efficient inspection by a different electron beam column.

Figure 4:
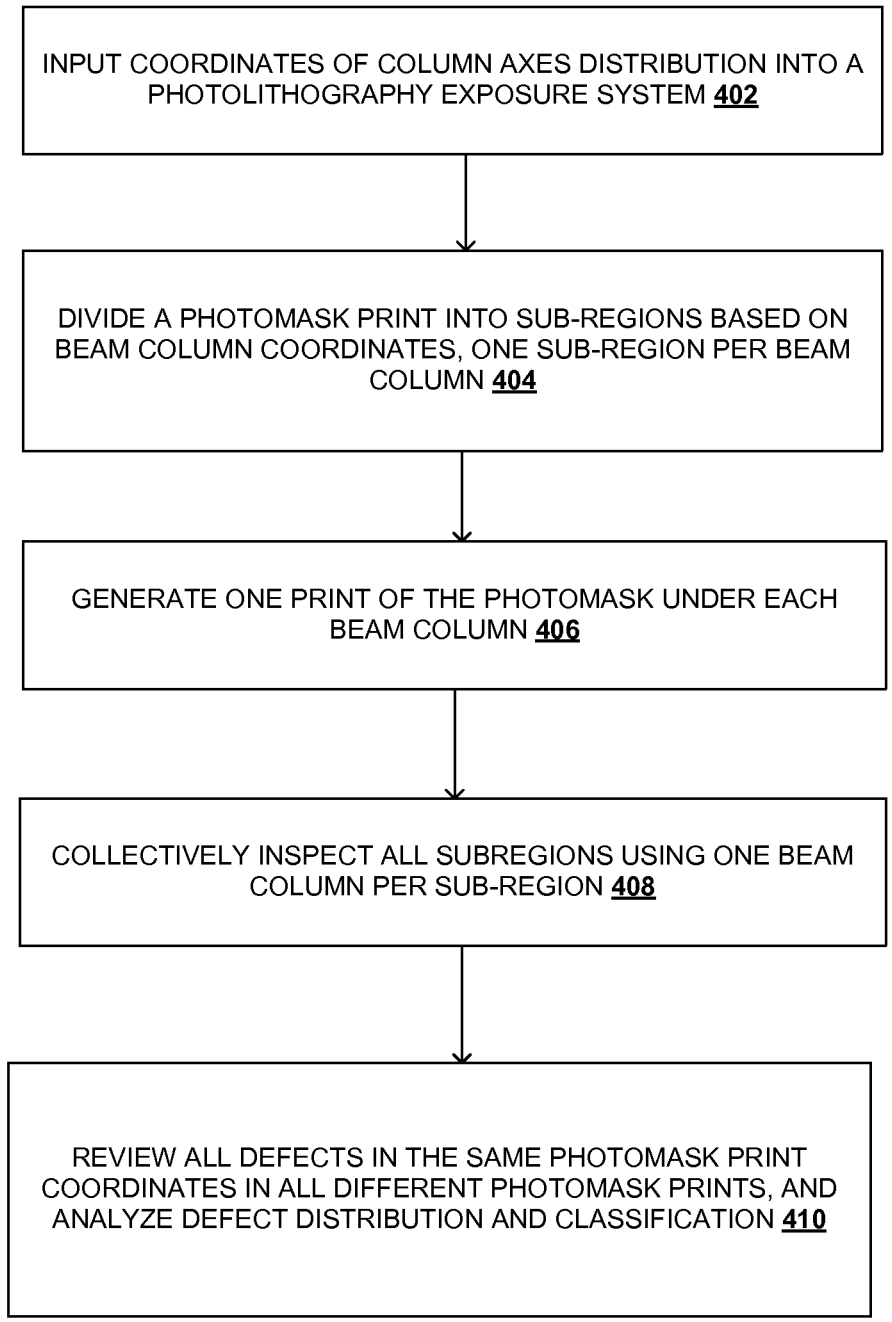
FIG. 4 illustrates a process embodiment for generating an inspection test wafer with a custom photomask print layout for the application of photomask defect inspection.
Figure 5:
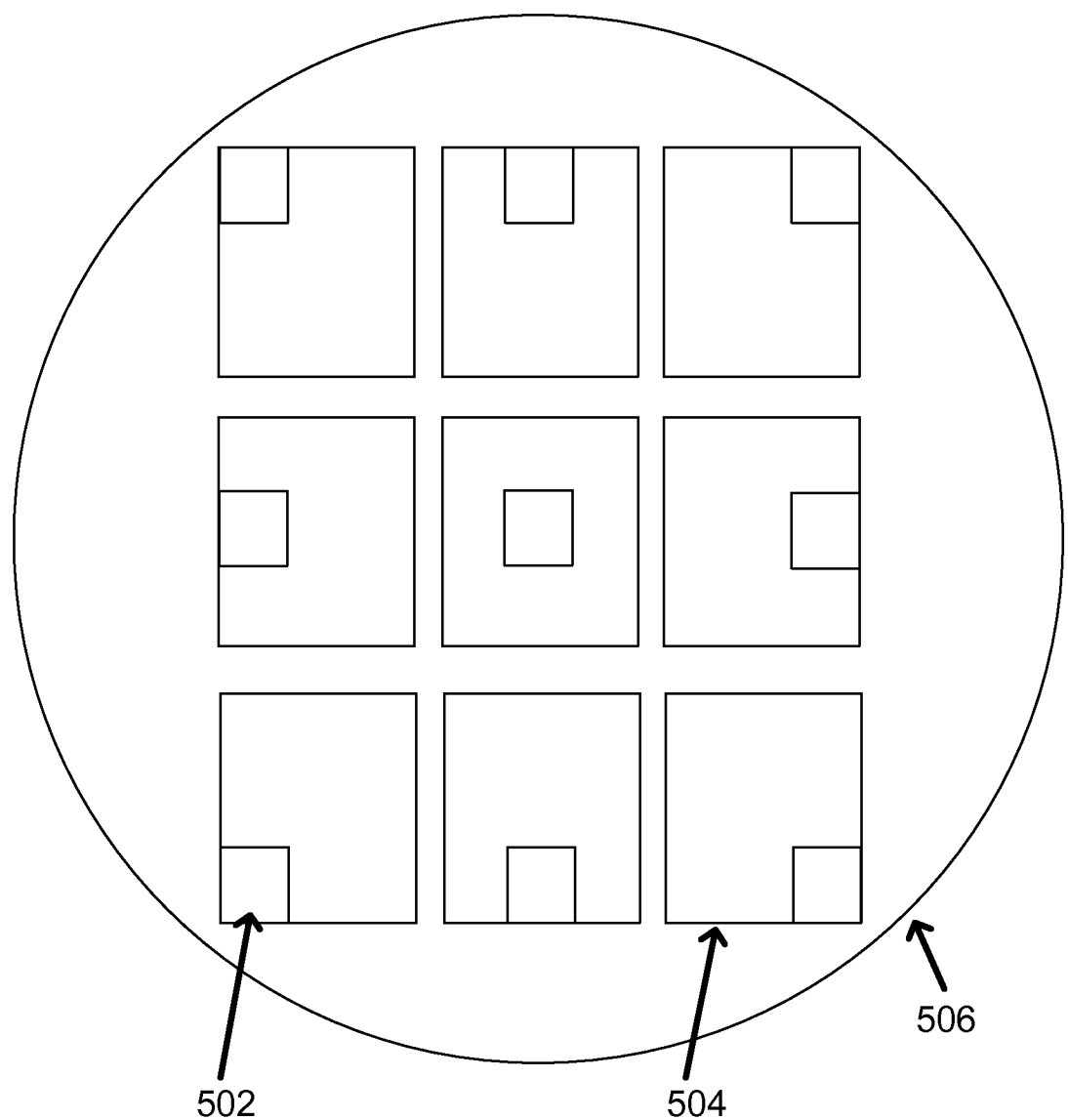
FIG. 5 illustrates an exemplary inspection sub-region allocation on an inspection test wafer with a custom photomask print layout for the application of photomask defect inspection.

FIG. 4 illustrates an exemplary process embodiment for generating an inspection test wafer for application of photomask printable defects inspection. A geometric map defining coordinates of a multi-column electron beam array is input into a photolithography exposure system (402). The system divides the entire photomask print into sub-regions based on the beam column coordinates, and assigns each beam column of the array to inspect a different sub-region of the photomask print (404 and 502). The inspection test wafer (506) is coated with photoresist according to photo-lithographical requirements. The photolithography system applies an inspection test recipe to generate repeated photomask prints under each beam column (406 and 504). Each beam column inspects a different sub-region of the photomask prints on the wafer, such that all parts of the repeated print pattern are inspected simultaneously (408). The photo-lithographically exposed features on the inspection test wafer are developed.

Figure 6:
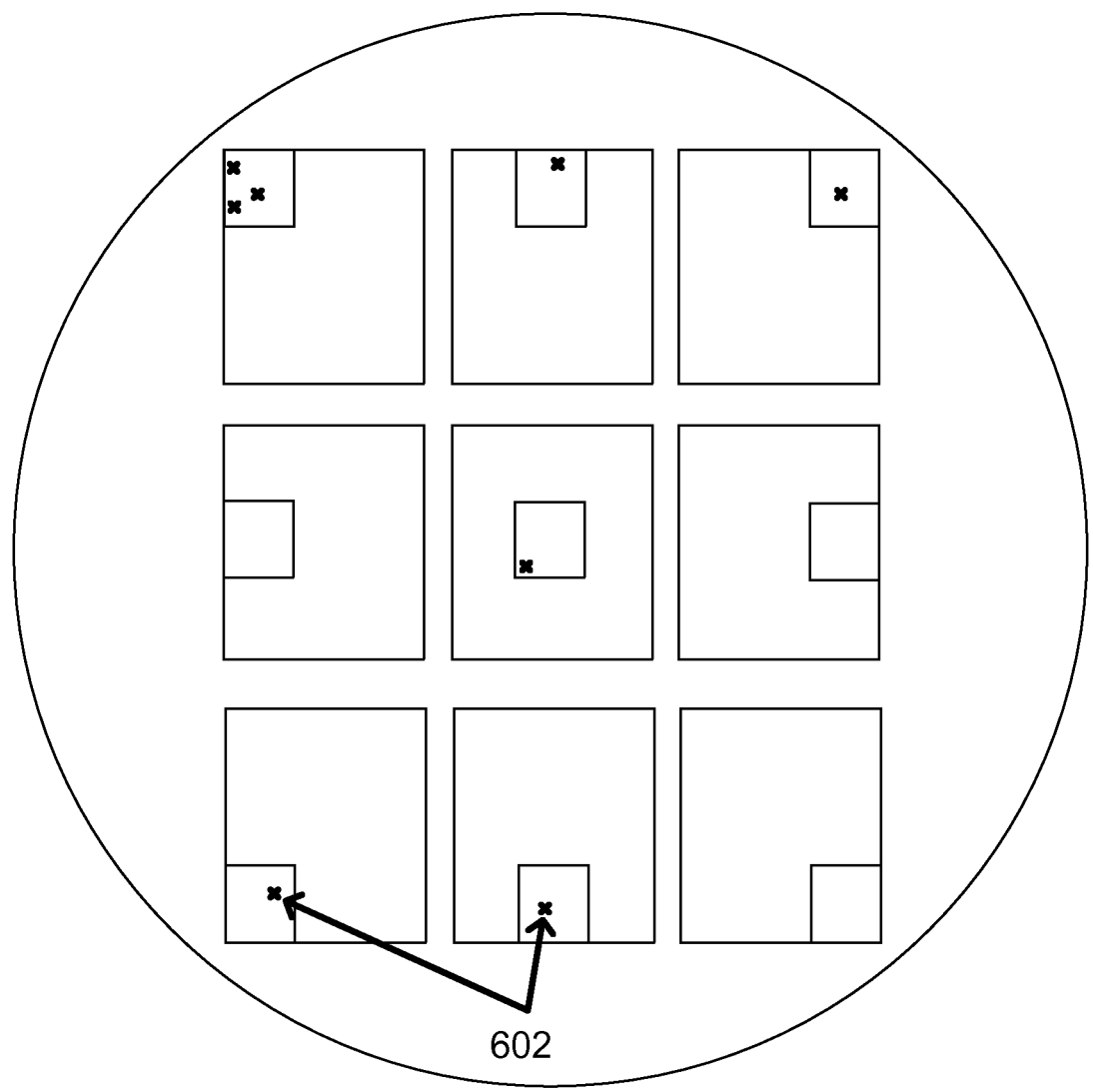
FIG. 6 illustrates exemplary integrated defects (spots) distribution detected by separate beam columns on an inspection test wafer with a custom photomask print layout.

Photo-lithographical important defects (e.g., photomask defects) will occur on every repeated photomask print on the wafer. FIG. 6 illustrates exemplary defects (602) detected by separate beam columns on an inspection test wafer with photomask prints. Defect locations are integrated into an overall defect distribution for one photomask print. This integrated distribution will include repeating defects and some non-repeating defects.

Figure 7:
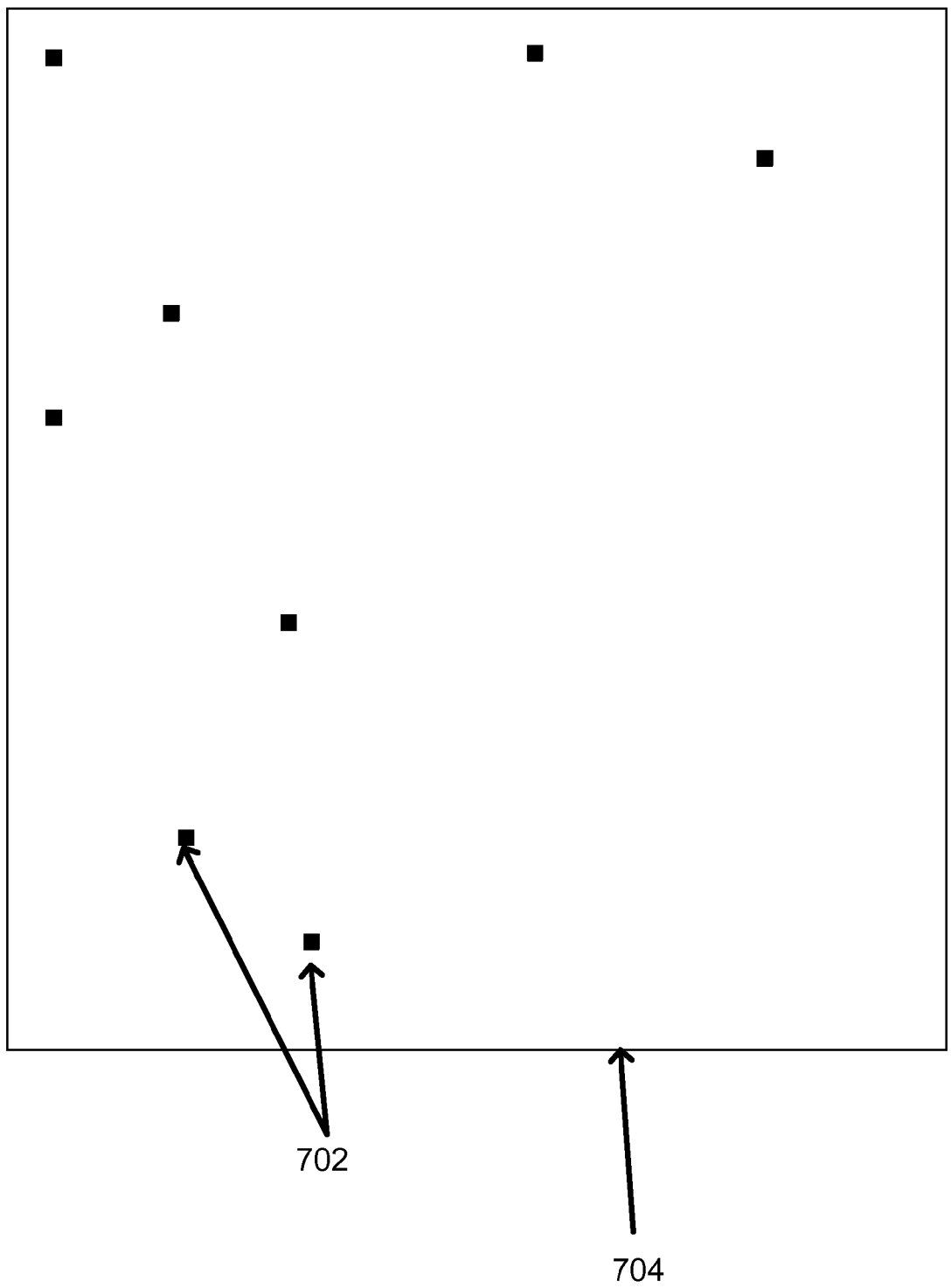
FIG. 7 illustrates an example of an integrated defect distribution in a photomask print coordinate formed from the defects detected in the different sub-regions.

FIG. 7 illustrates an example of an integrated defect distribution (translated into defect locations (702) on a photomask (704)) formed from the defects (602) detected in the different sub-regions as illustrated in FIG. 6. An electron beam review system may review the defect spots across different photomask prints on the inspection test wafer (or on a production wafer) in order to classify defects, for example, to classify whether a defect is repeating as a result of photo-lithographical errors, or non-repeating from other defect sources, for example the presence of contaminant particles (410). Photo-lithographically repeating defect distribution coordinates from the photomask print are mapped to physical positions on the photomask. The defect coordinates on the photomask may be input to a defect review system on photomask itself to classify defects or to carry out a photomask reparation process.

Figure 8:
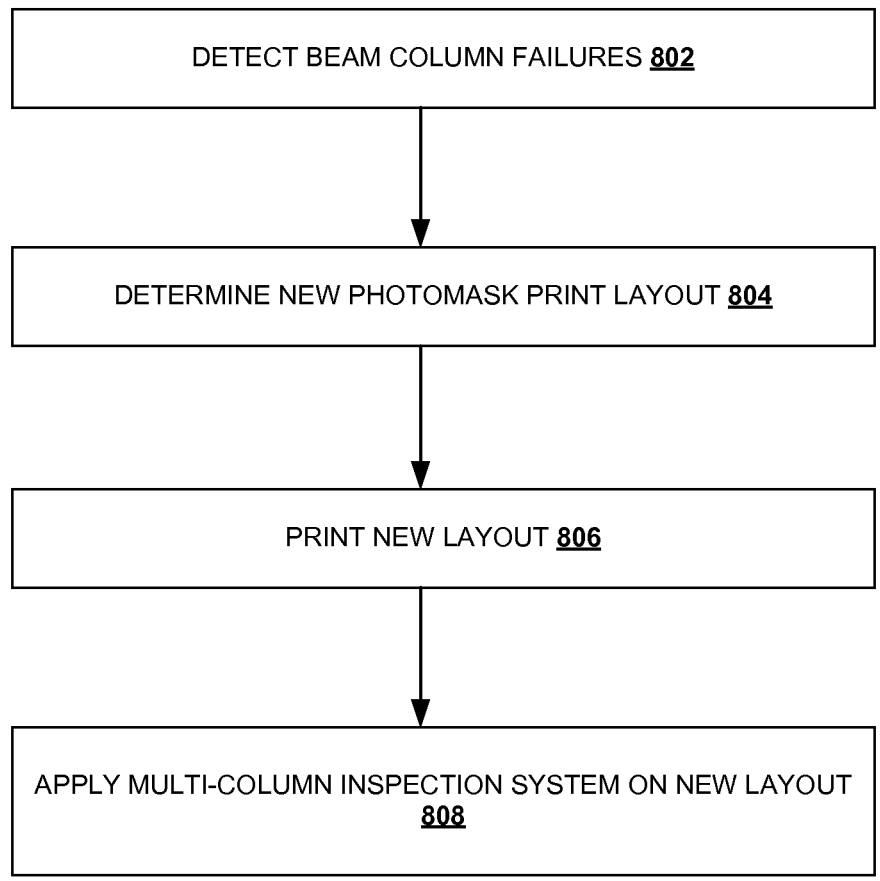
FIG. 8 illustrates a process embodiment for reconfiguration of a print layout to compensate for beam column failure.
Figure 9:
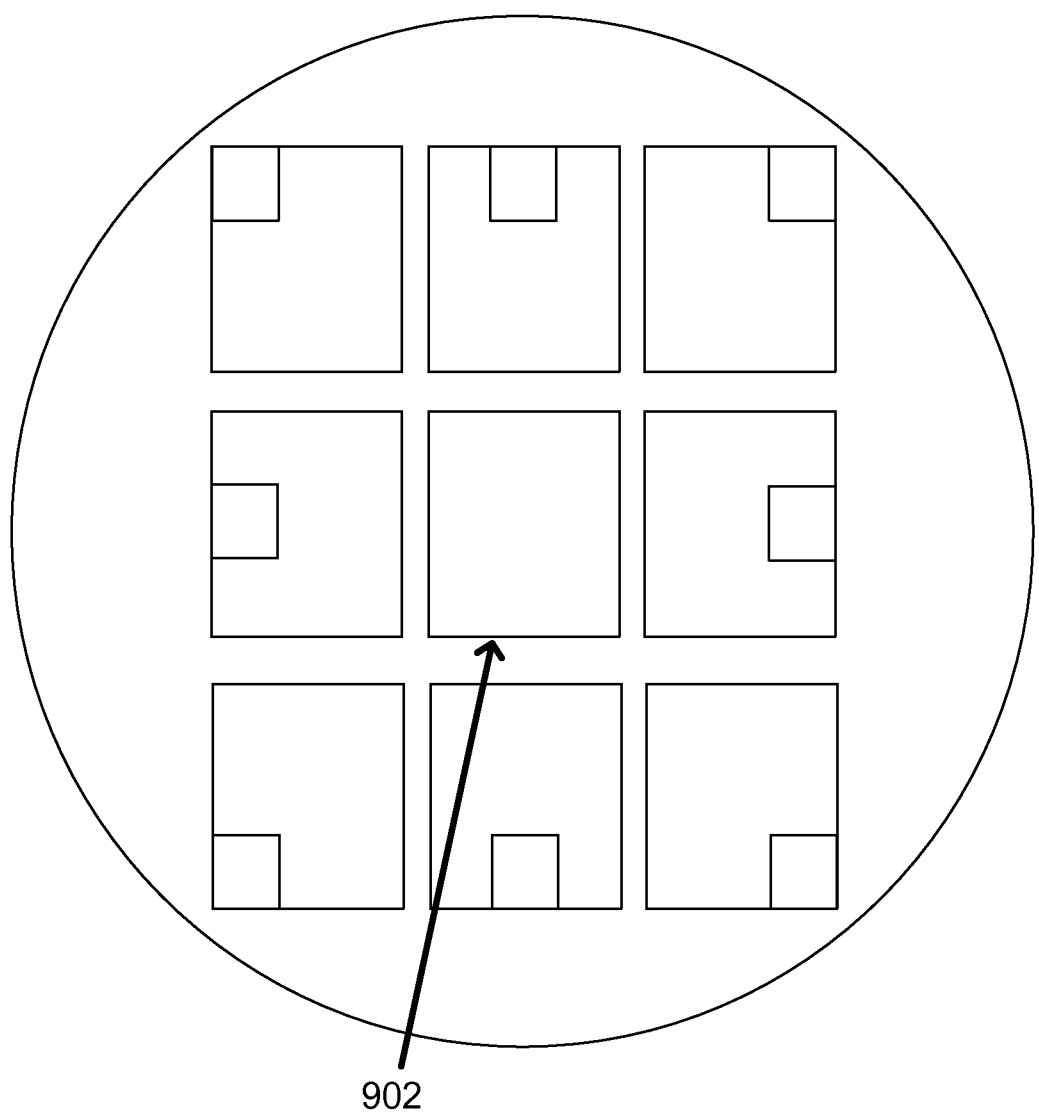
FIG. 9 illustrates an example where the central part of the photomask print cannot be inspected with the failed central column of the 3×3 multi-column inspection system.

Some beam columns may break down over time. FIG. 8 illustrates a process embodiment for reconfiguration of a print layout to compensate for beam column failure. When a beam column failure is detected (802), the print layout may be modified to generate new inspection sub-regions in order to compensate for the change of the number of working beam columns (804). The new sub-regions may differ substantially from the prior (before reconfiguration) sub-regions. The new print layout is printed (806) and completely inspected by the multi-column beam array even without the failed column (808). For example, FIG. 9 illustrates an example where the central part of the photomask print cannot be inspected with the central column (902) of the 3×3 multi-column inspection system.

Figure 10:
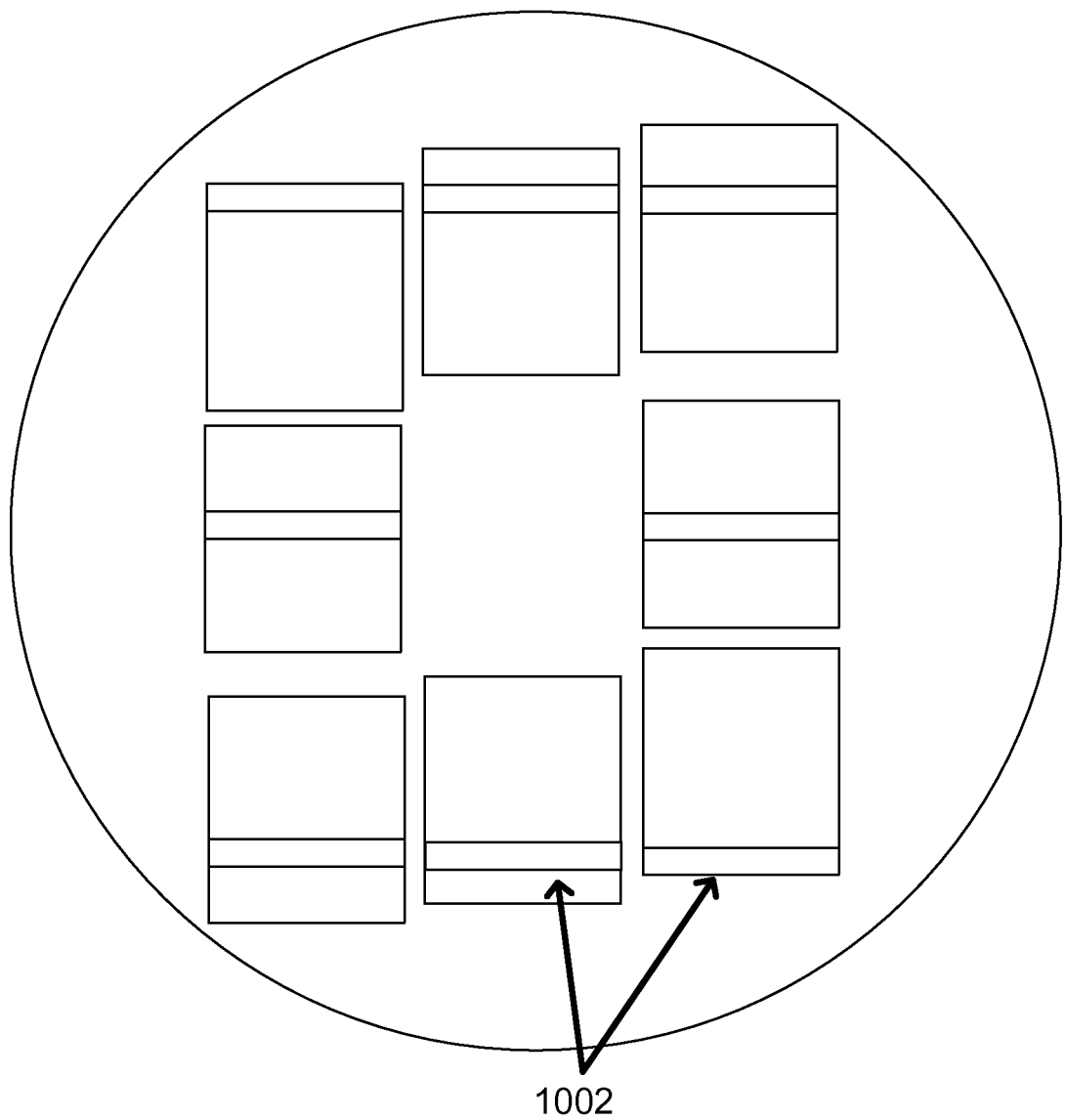
FIGS. 10 and 11 illustrate an example reconfigured photomask print layout on an inspection test wafer plane in order to compensate for the missed central area.
Figure 11:
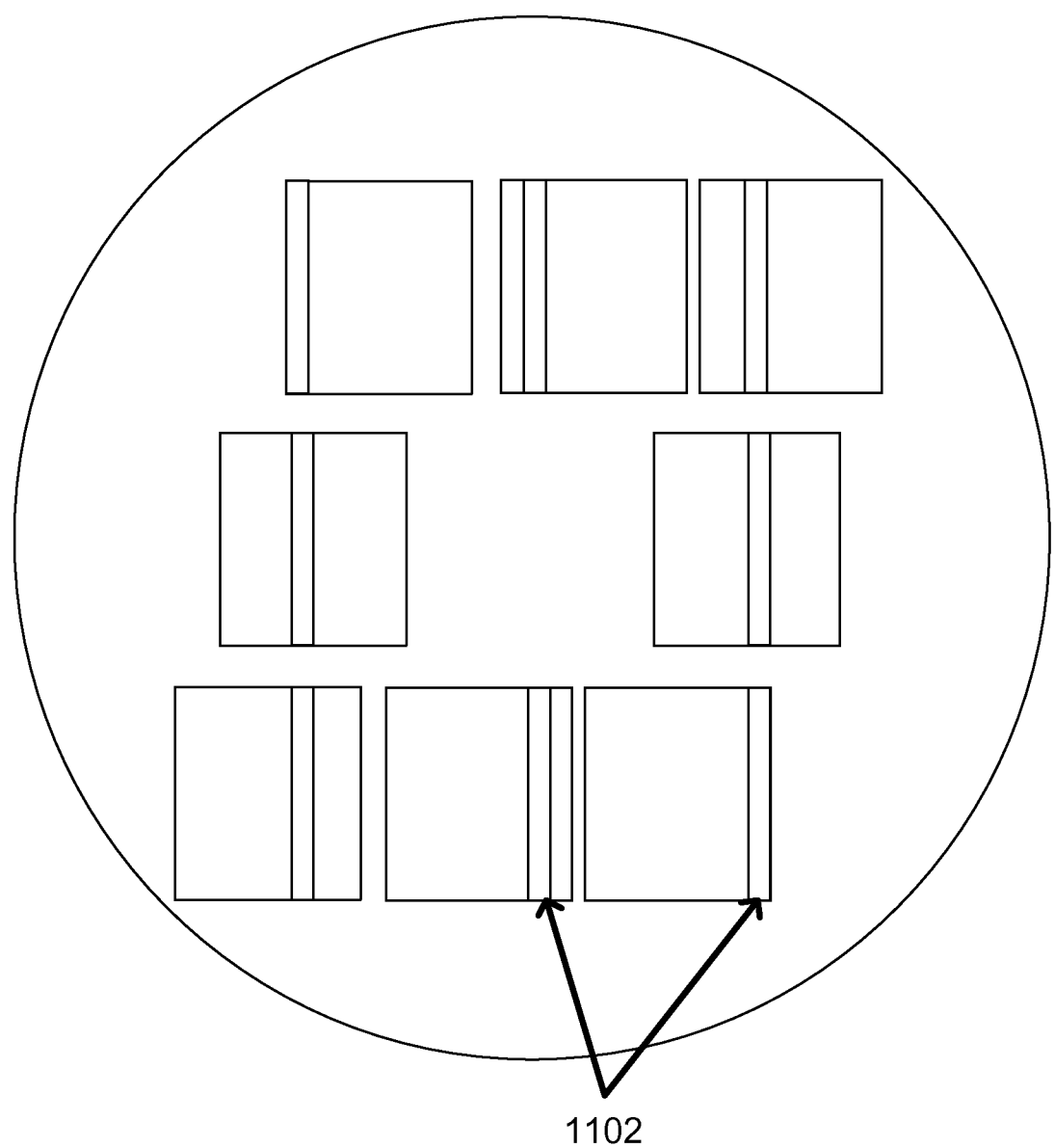

FIGS. 10 and 11 illustrate examples of reconfigured photomask print layout on the wafer plane in order to compensate for the missed central area. Note the substantial reconfiguration of the inspection sub-regions, which now comprise the full horizontal span (1002) or vertical span (1102) of the print. The photomask print is now inspected by over eight sub-regions instead of nine, which collectively covers the entire patterns of a photomask print.

Figure 12:
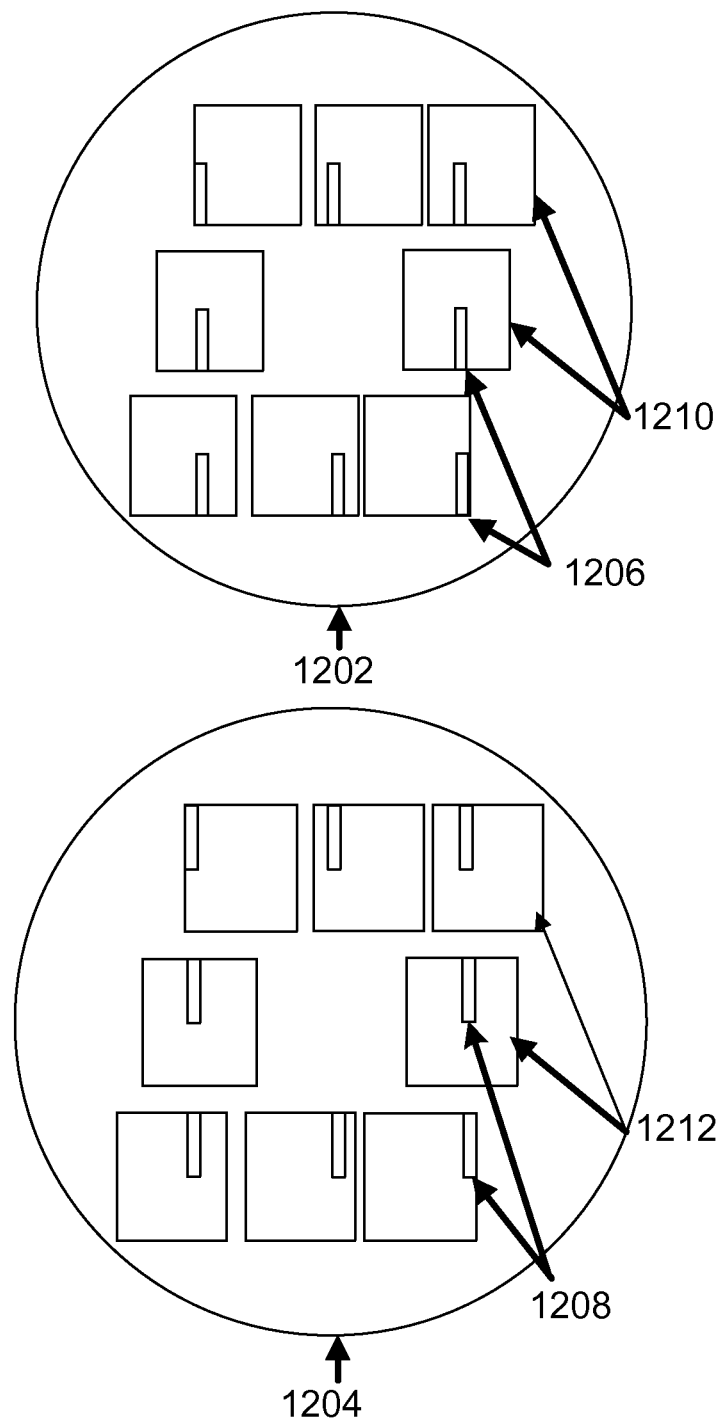
FIG. 12 illustrates an example of two inspection test wafers used to collectively inspect 16 inspection sub-regions.

In order to further increase the throughput, multiple multi-column electron beam inspection systems may collaborate to inspect different sub-regions of a full photomask print. FIG. 12 illustrates an example of two inspection test wafers (1202 and 1204) used in two multi-column electron beam inspection systems to collectively inspect 16 inspection sub-regions. Inspection sub-regions are divided into two groups (1206 and 1208) of eight sub-regions, and each group of sub-regions is inspected by a different multi-column inspection system, respectively.

Figure 13:
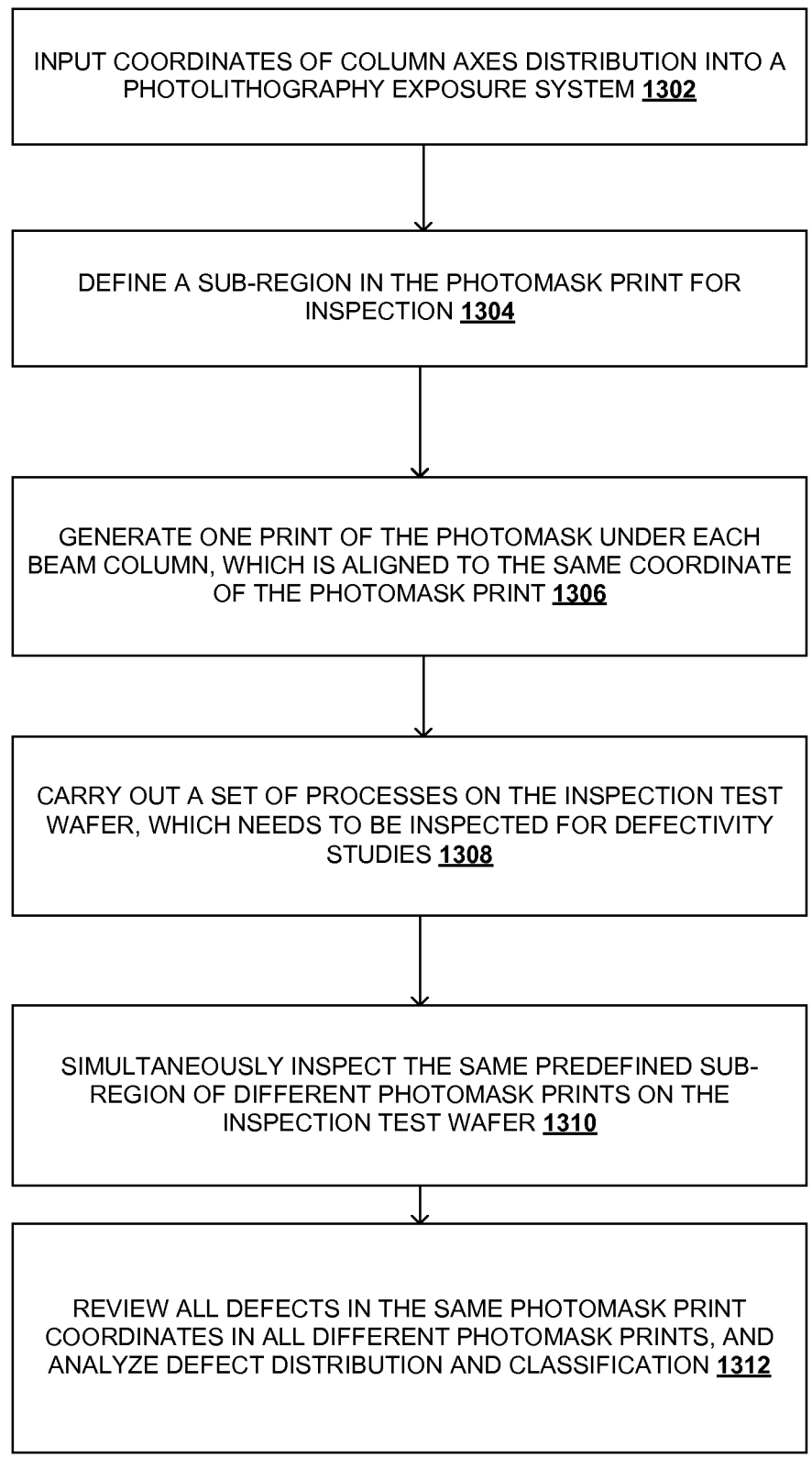
FIG. 13 illustrates a process embodiment for generating an inspection test wafer with a custom photomask print layout for an inspection application of global process uniformity and optimization.

FIG. 13 illustrates an exemplary process embodiment for generating an inspection test wafer to inspect the same photomask print sub-regions at different wafer locations. In this example, each beam column is aligned to the same photomask print coordinate. A geometric map defining coordinates of a multi-column electron beam array is input into a photolithography exposure system (1302). The system determines sub-regions of the photomask prints, which are to be inspected, and assigns each beam column of the array to inspect the same sub-region of each photomask print (1304). The inspection test wafer is coated with photoresist according to photo-lithographical requirements. The photolithography system applies an inspection test recipe to generate repeated photomask prints under each beam column, and each beam column is aligned to the same coordinate of the photomask print (1306). Certain wafer fabrication processes (eg etching, thermal annealing, deposition), which are to be inspected, may carried out after photolithography processes (1308). Each beam column inspects the same predefined sub-region of a different photomask prints on the inspection test wafer (1310). Defects detected during the inspection process may be further review for false detection and classification purposes (1312).

Figure 14:
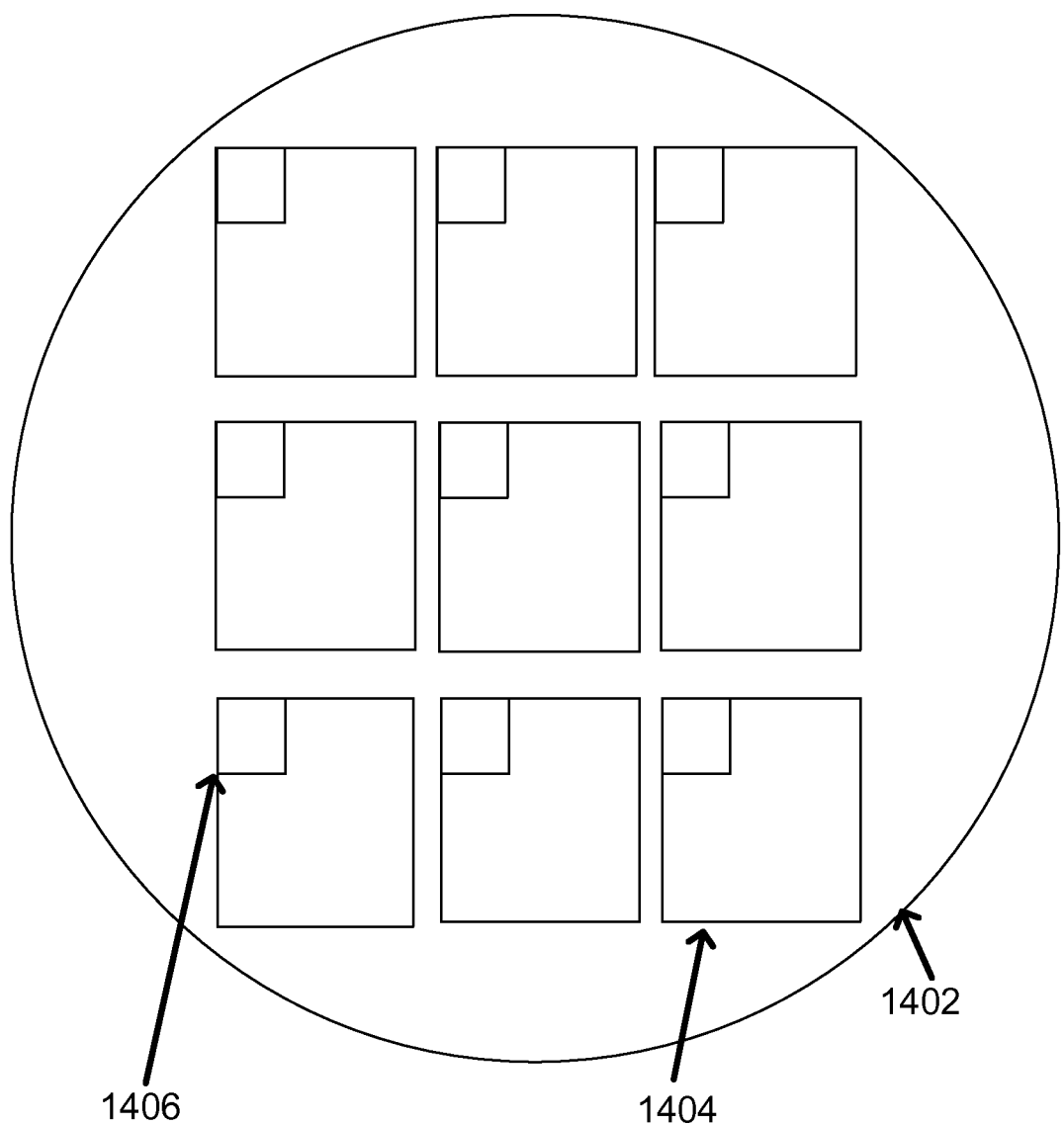
FIG. 14 illustrates an example of an inspection test wafer with a photomask layout, where each beam column is aligned to the same coordinate of a different photomask print.

FIG. 14 illustrates an example of an inspection test wafer (1402) with photomask layout, where each beam column is aligned to the same coordinate of a different photomask print (1404). The same sub-regions with same patterns (1406) will be inspected after a certain set of predefined processes (eg etching, deposition, and rapid thermal annealing).

Figure 15:
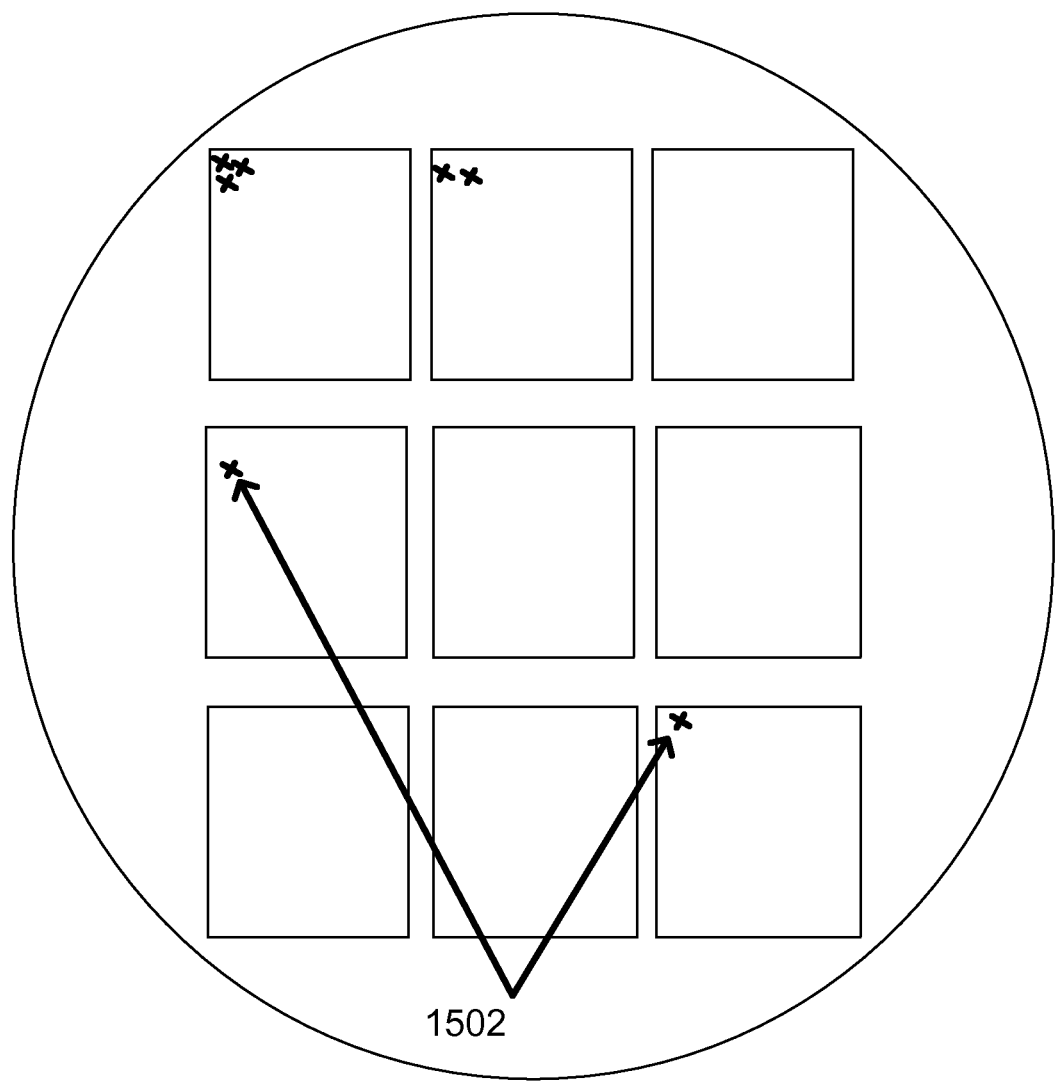
FIG. 15 illustrates an example of a defect distribution detected in different photomask prints on an inspection test wafer as illustrated in FIG. 14.

FIG. 15 illustrates an example of a defect (1502) distribution detected in different photomask prints on an inspection test wafer as illustrated in FIG. 14.

Figure 16:
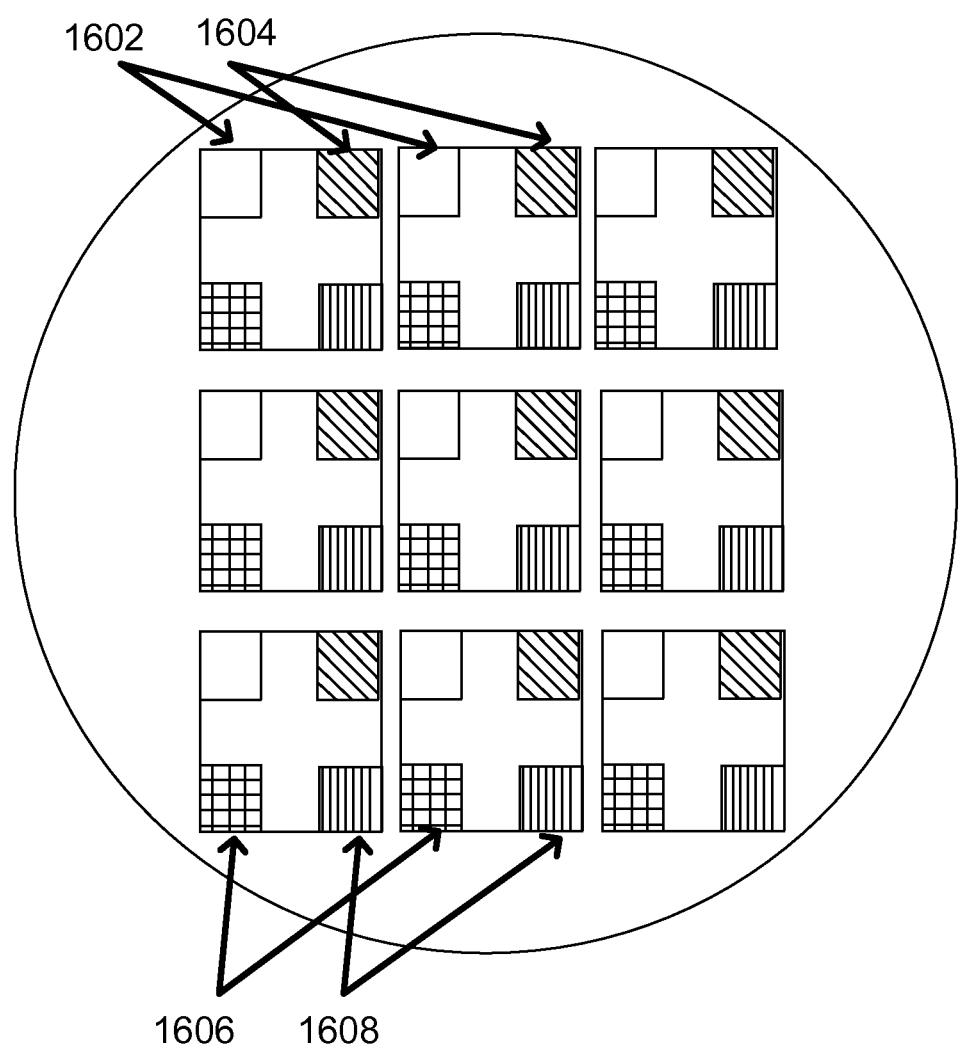
FIG. 16 illustrates that multiple multi-column systems can use multiple inspection test wafers to inspect process uniformity of different photomask print sub-regions simultaneously in order to further improve the inspection throughput and inspection sensitivity.

FIG. 16 illustrates that multiple multi-column systems can use multiple inspection test wafers to inspect process uniformity of different photomask print sub-regions (1602, 1604, 1606, 1608) simultaneously in order to further improve the inspection throughput and inspection sensitivity.

Figure 17:
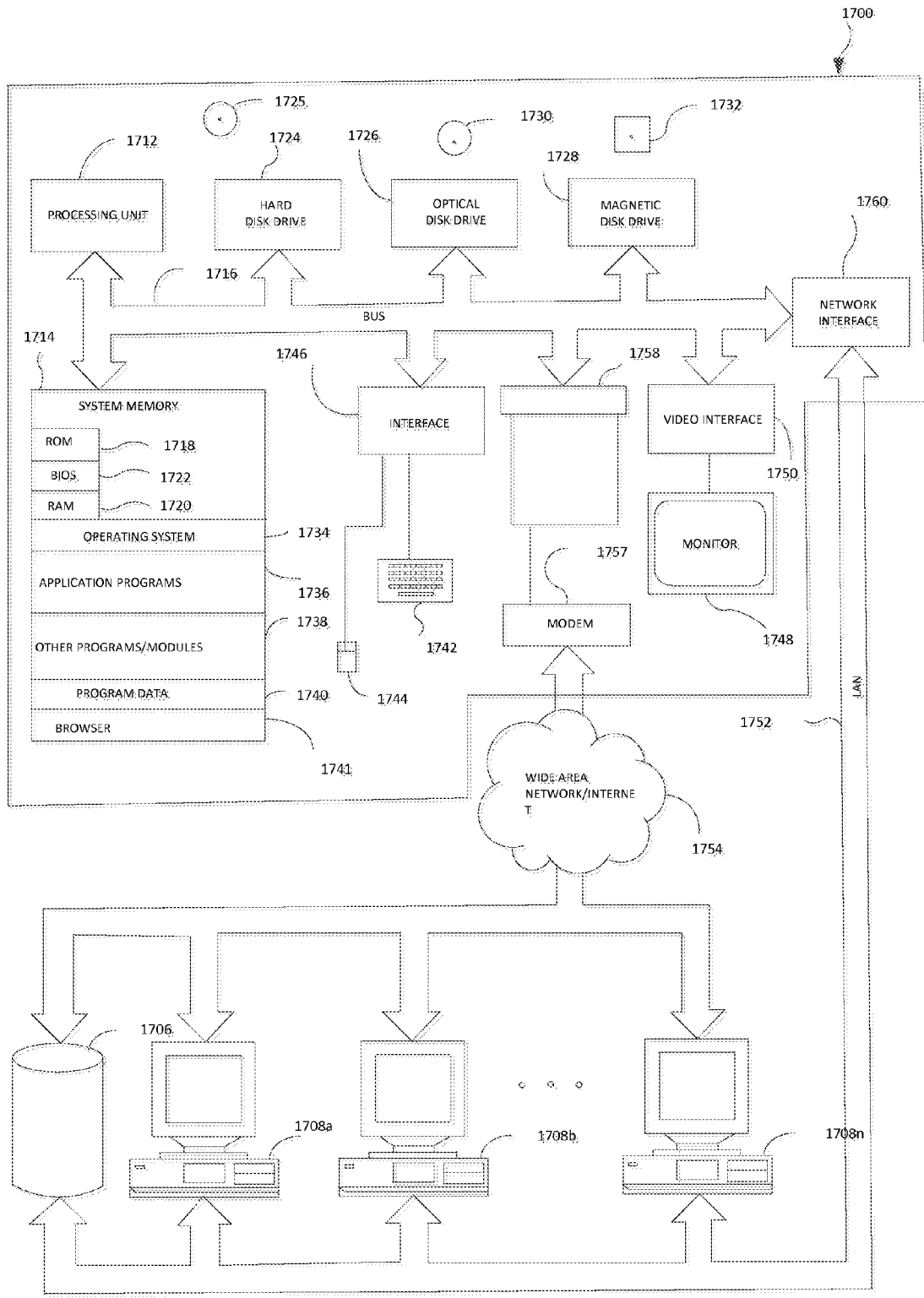
FIG. 17 illustrates an embodiment of a computer system 1700 that may implement an embodiment of a wafer inspection process.

FIG. 17 illustrates an embodiment of a computer system 1700 that may implement an embodiment of a wafer inspection process as described herein. A particular computer system 1700 of the machine network may include one or more processing units 1712, a system memory 1714 and a system bus 1716 that couples various system components including the system memory 1714 to the processing units 1712. The processing units 1712 may be any logic processing unit, such as one or more central processing units (CPUs), digital signal processors (DSPs, application-specific integrated circuits (ASICs), field programmable gate arrays (FPGAs), etc. The system bus 1716 can employ any known bus structures or architectures, including a memory bus with memory controller, a peripheral bus, and a local bus. The system memory 1714 includes read-only memory (ROM) 1718 and random access memory (RAM) 1720. A basic input/output system (BIOS) 1722, which can form part of the ROM 1718, contains basic routines that help transfer information between elements within the computer system 1700, such as during start-up.

The computer system 1700 may also include a plurality of interfaces such as network interface 1760, interface 1758 supporting modem 1757 or any other wireless/wired interfaces.

The computer system 1700 may include a hard disk drive 1724 for reading from and writing to a hard disk 1725, an optical disk drive 1726 for reading from and writing to removable optical disks 1730, and/or a magnetic disk drive 1728 for reading from and writing to magnetic disks 1732. The optical disk 1730 can be a CD-ROM, while the magnetic disk 1732 can be a magnetic floppy disk or diskette. The hard disk drive 1724, optical disk drive 1726 and magnetic disk drive 1728 may communicate with the processing unit 1712 via the system bus 1716. The hard disk drive 1724, optical disk drive 1726 and magnetic disk drive 1728 may include interfaces or controllers (not shown) coupled between such drives and the system bus 1716, as is known by those skilled in the relevant art. The drives 1724, 1726 and 1728, and their associated computer-readable storage media 1725, 1730, 1732, may provide non-volatile and non-transitory storage of computer readable instructions, data structures, program modules and other data for the computer system 1700. Although the depicted computer system 1700 is illustrated employing a hard disk 1724, optical disk 1726 and magnetic disk 1728, those skilled in the relevant art will appreciate that other types of computer-readable storage media that can store data accessible by a computer may be employed, such as magnetic cassettes, flash memory, digital video disks (DVD), Bernoulli cartridges, RAMs, ROMs, smart cards, etc. For example, computer-readable storage media may include, but is not limited to, random access memory (RAM), read-only memory (ROM), electrically erasable programmable read-only memory (EEPROM), flash memory, compact disc ROM (CD-ROM), digital versatile disks (DVD) or other optical disk storage, magnetic cassettes, magnetic tape, magnetic disk storage or other magnetic storage devices, solid state memory or any other medium which can be used to store the desired information and which may be accessed by processing unit 1712.

Program modules can be stored in the system memory 1714, such as an operating system 1734, one or more application programs 1736, other programs or modules 1738 and program data 1740. Application programs 1736 may include instructions that cause the processor(s) 1712 to carry out aspects of a wafer inspection process as described herein. Other program modules 1738 may include instructions for handling security such as password or other access protection and communications encryption, and for controlling and receiving data from a a multi-column electron beam array. The system memory 1714 may also include communications programs, for example, a Web client or browser 1741 for permitting the computer system 1700 to access and exchange data with sources such as Web sites of the Internet, corporate intranets, extranets, or other networks and devices as described herein, as well as other server applications on server computing systems. The browser 1741 in the depicted embodiment is markup language based, such as Hypertext Markup Language (HTML), Extensible Markup Language (XML) or Wireless Markup Language (WML), and operates with markup languages that use syntactically delimited characters added to the data of a document to represent the structure of the document. A number of Web clients or browsers are commercially available such as those from Mozilla, Google, and Microsoft.

Although illustrated as being stored in the system memory 1714, the operating system 1734, application programs 1736, other programs/modules 1738, program data 1740 and browser 1741 can be stored on the hard disk 1725 of the hard disk drive 1724, the optical disk 1730 of the optical disk drive 1726 and/or the magnetic disk 1732 of the magnetic disk drive 1728.

An operator can enter commands and information into the computer system 1700 through input devices such as a touch screen or keyboard 1742 and/or a pointing device such as a mouse 1744, and/or via a graphical user interface. Other input devices can include a microphone, joystick, game pad, tablet, scanner, etc. These and other input devices are connected to one or more of the processing units 1712 through an interface 1746 such as a serial port interface that couples to the system bus 1716, although other interfaces such as a parallel port, a game port or a wireless interface or a universal serial bus (USB) can be used. A monitor 1748 or other display device is coupled to the system bus 1716 via a video interface 1750, such as a video adapter. The computer system 1700 can include other output devices, such as speakers, printers, etc.

The computer system 1700 can operate in a networked environment using logical connections to one or more remote computers and/or devices. For example, the computer system 1700 can operate in a networked environment using logical connections to one or more mobile devices, landline telephones and other service providers or information servers. Communications may be via a wired and/or wireless network architecture, for instance wired and wireless enterprise-wide computer networks, intranets, extranets, telecommunications networks, cellular networks, paging networks, and other mobile networks. Communication may take place between the computer system 1700 and external devices via a WAN 1754 or LAN 1752. External devices may include other computer system 1708*a-n* (collectively, 1708) and external storage devices 1706.

Implementations and Alternatives

Those skilled in the art will recognize that it is common within the art to describe devices and/or processes in the fashion set forth herein, and thereafter use standard engineering practices to integrate such described devices and/or processes into larger systems.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediate components. Likewise, any two components so associated can also be viewed as being "operably connected", or "operably coupled", to each other to achieve the desired functionality.

The techniques and procedures described herein may be implemented via logic distributed in one or more computing devices. The particular distribution and choice of logic may vary according to implementation.

Those having skill in the art will appreciate that there are various logic implementations by which processes and/or systems described herein can be effected (e.g., hardware, software, and/or firmware), and that the preferred vehicle will vary with the context in which the processes are deployed. "Software" refers to logic that may be readily readapted to different purposes (e.g. read/write volatile or nonvolatile memory or media). "Firmware" refers to logic embodied as read-only memories and/or media. Hardware refers to logic embodied as analog and/or digital circuits. If an implementer determines that speed and accuracy are paramount, the implementer may opt for a hardware and/or firmware vehicle; alternatively, if flexibility is paramount, the implementer may opt for a solely software implementation; or, yet again alternatively, the implementer may opt for some combination of hardware, software, and/or firmware. Hence, there are several possible vehicles by which the processes described herein may be effected, none of which is inherently superior to the other in that any vehicle to be utilized is a choice dependent upon the context in which the vehicle will be deployed and the specific concerns (e.g., speed, flexibility, or predictability) of the implementer, any of which may vary. Those skilled in the art will recognize that optical aspects of implementations may involve optically-oriented hardware, software, and or firmware.

The foregoing detailed description has set forth various embodiments of the devices and/or processes via the use of block diagrams, flowcharts, and/or examples. Insofar as such block diagrams, flowcharts, and/or examples contain one or more functions and/or operations, it will be understood as notorious by those within the art that each function and/or operation within such block diagrams, flowcharts, or examples can be implemented, individually and/or collectively, by a wide range of hardware, software, firmware, or virtually any combination thereof. Several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in standard integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and/or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies equally regardless of the particular type of signal bearing media used to actually carry out the distribution. Examples of a signal bearing media include, but are not limited to, the following: recordable type media such as floppy disks, hard disk drives, CD ROMs, digital tape, and computer memory.

In a general sense, those skilled in the art will recognize that the various aspects described herein which can be implemented, individually and/or collectively, by a wide range of hardware, software, firmware, or any combination thereof can be viewed as being composed of various types of "circuitry." Consequently, as used herein "circuitry" includes, but is not limited to, electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes and/or devices described herein, or a microprocessor configured by a computer program which at least partially carries out processes and/or devices described herein), circuitry forming a memory device (e.g., forms of random access memory), and/or circuitry forming a communications device (e.g., a modem, communications switch, or optical-electrical equipment).

Those skilled in the art will recognize that it is common within the art to describe devices and/or processes in the fashion set forth herein, and thereafter use standard engineering practices to integrate such described devices and/or processes into larger systems. That is, at least a portion of the devices and/or processes described herein can be integrated into a network processing system via a reasonable amount of experimentation.

The foregoing described aspects depict different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

What is claimed is:

1. A semiconductor wafer inspection process, comprising:
   creating an inspection test wafer from a custom arrangement of photomask exposure layout different from a production print layout of a production wafer;
   inspecting the inspection test wafer for defects using a multi-column electron beam system;
   processing the inspection test wafer under the same conditions as the production wafer, except that the photolithography exposure step is modified to create an arrangement of photomask prints on the inspection test wafer plane to allocate and align sub-regions of each photomask print to a different beam column; and
   inspecting each one of the sub-regions in the repeated photomask prints on the wafer plane using a different column of the multi-column electron beam system.

2. The process of claim 1, where the sub-regions within each photomask print are offset from one another both in the x and y dimensions on the wafer plane by determined amounts.

3. The process of claim 1, wherein physical multi-column beam axis positions are first calibrated using a calibration wafer to obtain each beam axis' wafer coordinates, which includes designed hardware arrangements, mechanical errors, and assembly tolerances.

4. The process of claim 1, wherein if a beam column fails over time, the photomask print is re-generated and re-divided into a different number of sub-regions so that complete photomask print defect information continues to be inspected collectively and entirely by the remaining working beam columns.

5. The process of claim 1, wherein if a beam column fails over time, follow-up inspection is carried out by a single column electron beam system that scans for defects in the uninspected region corresponding to the beam column that failed.

6. The process of claim 1, wherein each sub-region is defined each with the same dimensions and orientations.

7. The process of claim 1, wherein critical regions of a repeated photomask print are divided into sub-regions, and a column beam condition for each sub-region is custom set for optimum detection of defects in the corresponding sub-region.

8. The process of claim 1, wherein critical areas of a repeated photomask print are divided into inspection sub-regions, each custom aligned to the physical positions of a corresponding beam column in order to optimize throughput and defect sensitivity during inspection.

9. The process of claim 8, wherein sub-regions are further allocated into different groups, and different groups on different inspection test wafers are inspected by different multi-column beam systems simultaneously.

10. The process of claim 1, wherein each beam column inspects a sub-region in a different photomask print on the inspection test wafer plane.

11. The process of claim 1, wherein more than one inspection test layout, each on a separate wafer, and more than one multi-column beam inspection system, are used for inspection of different sub-regions of an overall photomask print.

12. The process of claim 1, wherein a review process is applied to the inspection test wafer in order to further analyze and classify defects, and a photomask reparation process is carried out based on mapping from a collective defect distribution on the wafer plane to physical photomask coordinates corresponding to the detected defects.

13. The process of claim 1, wherein repeated photomask prints are arranged on the inspection test wafer plane so that each beam column scans a different corresponding sub-region of each photomask print.

* * * * *